US005475333A

United States Patent [19]

Kumagai

[11] Patent Number: 5,475,333
[45] Date of Patent: Dec. 12, 1995

[54] BUILT-IN DRIVE POWER-SOURCE SEMICONDUCTOR DEVICE

[75] Inventor: Naoki Kumagai, Kanagawa, Japan

[73] Assignee: Fuji Electric Co., Ltd., Kanagawa, Japan

[21] Appl. No.: 160,286

[22] Filed: Dec. 2, 1993

Related U.S. Application Data

[63] Continuation of Ser. No. 879,996, May 8, 1992, abandoned.

[30] Foreign Application Priority Data

May 10, 1991 [JP] Japan .................................. 3-105287
Dec. 27, 1991 [JP] Japan .................................. 3-346632

[51] Int. Cl.$^6$ .......................... H01J 19/82; G05F 1/10; H03K 17/16; G02B 27/00
[52] U.S. Cl. .................. 327/530; 327/533; 327/535; 327/537; 327/514; 327/515; 327/369; 327/389; 327/391; 250/551
[58] Field of Search .................. 307/296.1, 296.6, 307/296.7, 296.8, 311, 246, 570, 571, 573; 327/530, 533, 535, 537, 514, 515, 369, 389, 391; 250/551

[56] References Cited

U.S. PATENT DOCUMENTS

| 5,006,737 | 4/1991 | Fay ........................................... 307/311 |
| 5,047,988 | 9/1991 | Mizuta ................................... 307/296.6 |
| 5,057,694 | 10/1991 | Idaka et al. ............................ 307/311 |
| 5,107,138 | 4/1992 | Seki et al. ............................. 307/296.6 |

FOREIGN PATENT DOCUMENTS

| 0122907 | 10/1984 | European Pat. Off. . |
| 3731412A1 | 5/1988 | Germany . |
| 59-208937 | 11/1984 | Japan . |
| 1-77220 | 3/1989 | Japan . |
| 3-129920 | 6/1991 | Japan . |
| 1444168 | 7/1976 | United Kingdom . |
| 2049329 | 12/1990 | United Kingdom . |

OTHER PUBLICATIONS

Copy of Examiner's letter and Search Report.
European Search Report dated Sep. 22, 1992.

Primary Examiner—Timothy P. Callahan
Assistant Examiner—Trong Phan
Attorney, Agent, or Firm—Finnegan, Henderson, Farabow, Garrett & Dunner

[57] ABSTRACT

A built-in drive-power-source semiconductor device of low cost having a good switching characteristic and a decreased switching loss. In operation, a reference charge potential is applied to a charging IGBT by a first constant voltage diode thereby turning on the IGBT to charge a battery means. When the charge potential of the battery means reaches a prescribed level, a MOSFET is turned on by a second constant voltage diode, shortcircuiting the first constant voltage diode, causing the charging IGBT is turn off to eliminate overcharging of the batter means and maintain the potential of the battery means at a prescribed value. The semiconductor device includes a light emitting circuit for emitting light in response to an input control signal, a photo voltage generating circuit for charging the battery portion with at least a portion of the photo voltage generated in response to light from the light emitting circuit and, a disabling circuit for disabling the output IGBT when the battery means has not yet reached a sufficient level of charge potential.

36 Claims, 7 Drawing Sheets

BUILT-IN DRIVE POWER-SOURCE SEMICONDUCTOR DEVICE

This application is a continuation of application Ser. No. 07/879,996, now abandoned, filed May 8, 1992.

BACKGROUND OF THE INVENTION

1. Field of the Invention

The present invention relates to a built-in drive power-source semiconductor device, applicable for a power switching device, in which a drive power source can be obtained from a load power source. More particularly, the invention relates to an arrangement of a charging circuit fabricated into a semiconductor device. The present invention relates to improvements in the charging circuit of a built-in drive-power-source semiconductor device having an output insulated gate semiconductor element, a gate drive circuit for charging and discharging the gate of the insulated gate semiconductor element, a capacitor for supplying a power source to the gate drive circuit, and a charging circuit for charging the capacitor.

1. Discussion of the Related Art

FIG. 6 shows the circuit arrangement of a prior art built-in drive-power-source semiconductor device 1, proposed in Japanese Patent Application No. 1-266852 by the Assignee of the Present Patent Application. In the semiconductor device, an output switch portion 10 employs an output MOSFET 2 as an output insulated gate semiconductor element. The drain electrode or the source electrode of the MOSFET 2 is connected to a load (not shown). An output control portion 20 for driving the gate of the output MOSFET 2 to control the output switch portion 10 includes an enhancement MOSFET 32 for charging the gate of the output MOSFET 2, and a depletion MOSFET 35 for discharging the gate of the output MOSFET 2.

Both the MOSFETs 32 and 35 are connected in series. The drain electrode of the enhancement MOSFET 32 is connected to a power source receiving terminal 21 of the output control portion 20. The source electrode of the depletion MOSFET 35 is connected to terminal Pl of the load terminals of the semiconductor device, which is connected to the source electrode of the output MOSFET 2. In the output control portion 20, a parallel circuit comprising a photo diode array 29 and a resistor 31 is connected between the gate and source electrodes of the enhancement MOSFET 32. A parallel circuit comprising a photo diode array 33 and a resistor 34 is connected between the gate and source electrodes of the depletion MOSFET 35. Photo diode arrays 29 and 33 are disposed so that generate photo voltage in response to light received from the LED 13.

A battery portion 30 for providing a power source for the output control portion 20 consists of a capacitor 3. The high potential electrode 3a of the capacitor 3 is connected to the power source receiving terminal 21. A charging portion 40 for charging the capacitor 3 of the battery portion 30 during the rest or nonconductive period of the output MOSFET 2 comprises a charging circuit connected between load terminal Ph coupled with the drain electrode of the output MOSFET 2 and another load terminal Pl coupled with the source electrode of the output MOSFET 2 during the rest or nonconductive period of the output MOSFET 2. The charging portion 40 constitutes a charging MOSFET 5 and a reverse current blocking diode 6, which are connected in series between the drain electrode of the output MOSFET 2 and the high potential electrode 3a of the capacitor 3, and a current restricting resistor 7 and a first constant voltage diode 41, which are connected in series between the drain and source electrodes of the output MOSFET 2. The anode of the first constant voltage diode 41 is connected to the source electrode of the output MOSFET 2, and the cathode of the diode is connected to both the resistor 7 and the gate of the charging MOSFET 5. Thus, the first constant voltage diode 41 functions to drive the gate of the charging MOSFET 5.

To operate the output MOSFET 2 of the built-in drive-power-source semiconductor device, the LED 13 is turned on. When the LED 13 is turned on, the photo diode arrays 29 and 33 generate photo voltages. The photo voltage generated by the photo diode array 29 renders the enhancement MOSFET 32 conductive. A negative voltage is applied between the gate and source of the depletion MOSFET 35, so that the MOSFET 35 is rendered nonconductive. Accordingly, the voltage across the capacitor 3 is applied to the gate of the output MOSFET 2, thereby charging the gate and in turn operating the output MOSFET 2. Consequently, the load terminals Ph and Pl coupled with the output MOSFET 2 are connected. In this way, the semiconductor device functions as a switch.

To turn off the output MOSFET 2, the LED 13 is turned off. When the LED 13 is turned off, the photo voltages from both the diode arrays 29 and 33 disappear, so that the enhancement MOSFET 32 is rendered nonconductive, and the depletion MOSFET 35 is rendered conductive. As a result, the application of the voltage across the capacitor 3 to the gate of the output MOSFET 2 is stopped. The charge stored in the gate is discharged through the depletion MOSFET 35, so that the output MOSFET 2 becomes nonconductive.

The operation of the charging portion 40 will now be described. It is assumed that a high voltage substantially equal to the voltage of a load power source is applied across the source-drain path of the output MOSFET 2, and that no charge is stored in the capacitor 3. In this case, the potential of the source electrode is zero, and the potential at the gate of the MOSFET 5 takes a value determined by a voltage value across the first constant voltage diode 41. Since the voltage between the gate and source of the charging MOSFET 5 has been set to be in excess of the gate threshold value of the MOSFET 5, the charging MOSFET 5 becomes conductive. As a result, the capacitor 3 is charged by the voltage between the drain and source of the output MOSFET 2 through the charging MOSFET 5 and the reverse current blocking diode 6, so that the high potential electrode 3a of the capacitor is charged to a high potential. When the charging operation progresses and the potential at the high potential electrode 3a of the capacitor 3 is increased, the voltage between the gate and source of the charging MOSFET 5 decreases. As a result, the charging MOSFET 5 becomes nonconductive and the charging of the capacitor 3 is stopped. The potential increase at the high potential electrode 3a of the capacitor 3 stops. Accordingly, the potential at the high potential electrode 3a of the capacitor 3 is kept at a fixed value substantially equal to the difference between the voltage value across the first constant voltage diode 41 and the gate threshold value of the charging MOSFET 5. The voltage across the capacitor 3, which is kept at the fixed value, is applied to the power source receiving terminal 21 of the output control portion 20, and is used as a drive power source. The charge stored in the capacitor 3 is discharged through the charge/discharge at the gate of the output MOSFET 2, so that the potential at the high potential electrode 3a of the capacitor 3 decreases.

However, the capacitor is charged again in the next rest period of the output MOSFET 2, and is kept at the fixed value.

In the above prior art built-in drive power-source semiconductor device, the power-supplying capacitor for controlling the output MOSFET can be charged from an external circuit connected as a load to the output MOSFET. Therefore, there is no need for a special external power supply. The semiconductor device can be used as a semiconductor device having an on-board drive power source. In this respect, the built-in drive power-source semiconductor device is suitable for use as a switching element in a power source circuit provided independently of the control circuit portion.

A necessary improvement in this semiconductor device is the switching characteristic. In the conventional built-in drive-power-source semiconductor device, when the charging operation across the capacitor 3 progresses and the potential at the high potential electrode 3a increases, the voltage between the gate and the source electrodes of the charging MOSFET 5 decreases. The MOSFET 5 has an output having a saturation characteristic as exemplarily shown in FIG. 7. As shown, it exhibits a constant current characteristic in the region where the drain-source voltage $V_{DS}$ is high. As also shown in FIG. 7, the current value decreases as the gate-source voltage $V_{GS}$ decreases, for example, from $V_{GS6}$ to $V_{GS1}$. Thus, in the conventional built-in drive-power-source semiconductor device, as the charging of the capacitor 3 progresses and the gate-source voltage $V_{GS}$ decreases, the charging ability of the charging MOSFET 5 is reduced.

As an example, it is desirable that variations in the power source voltage supplied to the output switch portion 10 to drive the output control portion 20 be suppressed in order to improve the switching characteristic of the semiconductor device. Accordingly, variations in the potential at the high potential electrode 3a must be suppressed. However, when the capacitance of the capacitor 3 is set to a large value in order to suppress variations in the power source voltage, the charging time is drastically increased because the voltage $V_{GS}$ between the gate and source electrodes of the charging MOSFET 5 is always low. As a result, it is impossible to increase the drain current to charge the capacitor 3 through the charging MOSFET 5, and the charging time is increased. For this reason, when the on-state time of the output MOSFET 2 is long and the off-state time is short, the capacitor 3 is insufficiently charged. Accordingly, the voltage to drive the output control portion 20 drops, resulting in insufficient charge of the gate of the output MOSFET 2. Due to the increased loss generated in the output MOSFET 2, it is impossible to obtain the switching characteristic required by the control signal.

In a case in which the charging MOSFET has a satisfactory charging capability, the capacitor can be sufficiently charged within the period that the drain-source voltage of the output MOSFET 2 remains low immediately after the MOSFET 2 is turned off. Accordingly, the loss generated in the charging MOSFET 5 can be reduced.

On the other hand, in a case in which the charging MOSFET has an unsatisfactory charging capability, the capacitor 3 continues to be charged even after the drain-source voltage of the output MOSFET 2 has reached a high value after the MOSFET 2 is turned off. This leads to an increase in the loss generated in the charging MOSFET 5.

To solve the above problems, it has been proposed that a high-voltage diode be used as the constant voltage diode 41 so that the charging MOSFET 5 charges the capacitor when its gate-source voltage $V_{GS}$ is high, in order to improve the switching characteristic. As a result, the capacitor 3 is rapidly charged and the potential at electrode 3a becomes high. Therefore, the increased losses generated in the charging MOSFET can be eliminated. However, this solution results in an increased cost of the overall device. In the above configuration, high potentials are applied between the gate and source of the output MOSFET 2, between the corresponding electrodes of the charging MOSFET 5, and to the output control portion 20. As a result, high breakdown voltage components must be used for those elements, increasing the cost of the overall device.

At a time when the capacitor is not yet charged to a voltage sufficient to drive the output control portion, such as when charging is in an initial stage or when the on-time of the output MOSFET 2 is high resulting in an unsatisfactory charging capability, the output switch portion may be erroneously operated due to load potential operation. When the power source of the battery portion 30 is insufficiently charged, the depletion MOSFET 35 is at a high impedance. Under this condition, if the load potential for the output MOSFET 2 varies, current flows through a path between the drain and gate of the output MOSFET 2 created by the drain-gate capacitance. Accordingly, the gate potential of the output MOSFET 2 increases, causing a risk that terminals Ph and Pl may be short-circuited. In particular, when the semiconductor devices are incorporated into the upper and lower arms of a bridge circuit, for example, turn-on due to potential variation may cause the upper and lower arms to simultaneously turn on, thereby causing a short-circuit. Therefore, in the interest of safety, it is desired that a highly reliable switching characteristic be obtained by eliminating turn-on due to potential variation.

It is noted that in the conventional semiconductor device, the charging portion is allowed to operate only when a satisfactory potential difference appears between the load terminals Ph and Pl. Accordingly, when the on-state time of the output switch portion is long, current leakage from the diodes, MOSFETs, and other components in the output control portion will cause the voltage across the battery portion capacitor to decrease. In addition, the charging of the capacitor tends to terminate when the charging MOSFET is turned on again. Hence, the gate of the output MOSFET 2 is insufficiently charged, increasing the loss in the output MOSFET 2. Consequently, it is difficult to obtain the switching characteristic specified by the control signal.

SUMMARY OF THE INVENTION

The present invention has been made in view of the above circumstances and has as an object, without using elements of high breakdown voltage, a built-in drive-power-source semiconductor device which is reliable in operation, low in cost and good in switching characteristic, and free from the possibility of erroneous operation caused by an insufficient power source voltage, and which may rapidly reach a prescribed drive power source voltage even when the output insulated gate semiconductor element has a high on-time.

To achieve the object and in accordance with the purpose of the invention, as embodied and broadly described herein, the built-in drive-power-source semiconductor device of this invention comprises output switch means for switching power between first and second terminals external to the semiconductor device, output control means for controlling the output switch means in response to an input control signal, battery means for supplying drive power to the output control means, charging means for charging the battery means from a circuit external to the semiconductor device, the charging means including constant voltage output means, connected to the external circuit, for providing a charge reference potential, charge switch means for conducting charge current to the battery means from the external circuit in response to the charge reference potential, and charge termination means for turning off the charge switch means when a charge potential of the battery means reaches a predetermined charge potential level, thereby avoiding excessive charging of the battery means.

In the built-in drive-power-source semiconductor device, if the charge switch means is an insulated gate semiconductor element receiving the reference charge potential as a gate potential, the charge termination means may include a charge potential determining means for determining a charge potential of the battery means, and an off-switch means, connected to the gate of the insulated gate semiconductor element, for bypassing the constant voltage output means when the determined charge potential of the battery means reaches the predetermined level, for setting the charge reference potential to a level sufficient to turn off the semiconductor element.

To avoid erroneous operation when the charge potential is not yet sufficient, it is effective to additionally use a disabling means for disabling the output switch means when the charge potential of the battery means is less than the predetermined charge potential level.

To reduce the voltage drop in the battery portion when the output control means includes light-emitting means for emitting light in response to the input control signal and photo-voltage generating means for generating photo-voltage in response to the emitted light, the charging means may include means for conducting at least a portion of the photo-voltage to the battery means for charging the battery means. Further, the output control means preferably includes means for converting the photo-voltage to an output control signal, and means for transmitting the output control signal to the output switch means. In addition, the light emitting means may include an LED, and the photo-voltage generating means may include a photo transistor array.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

Figure 1:
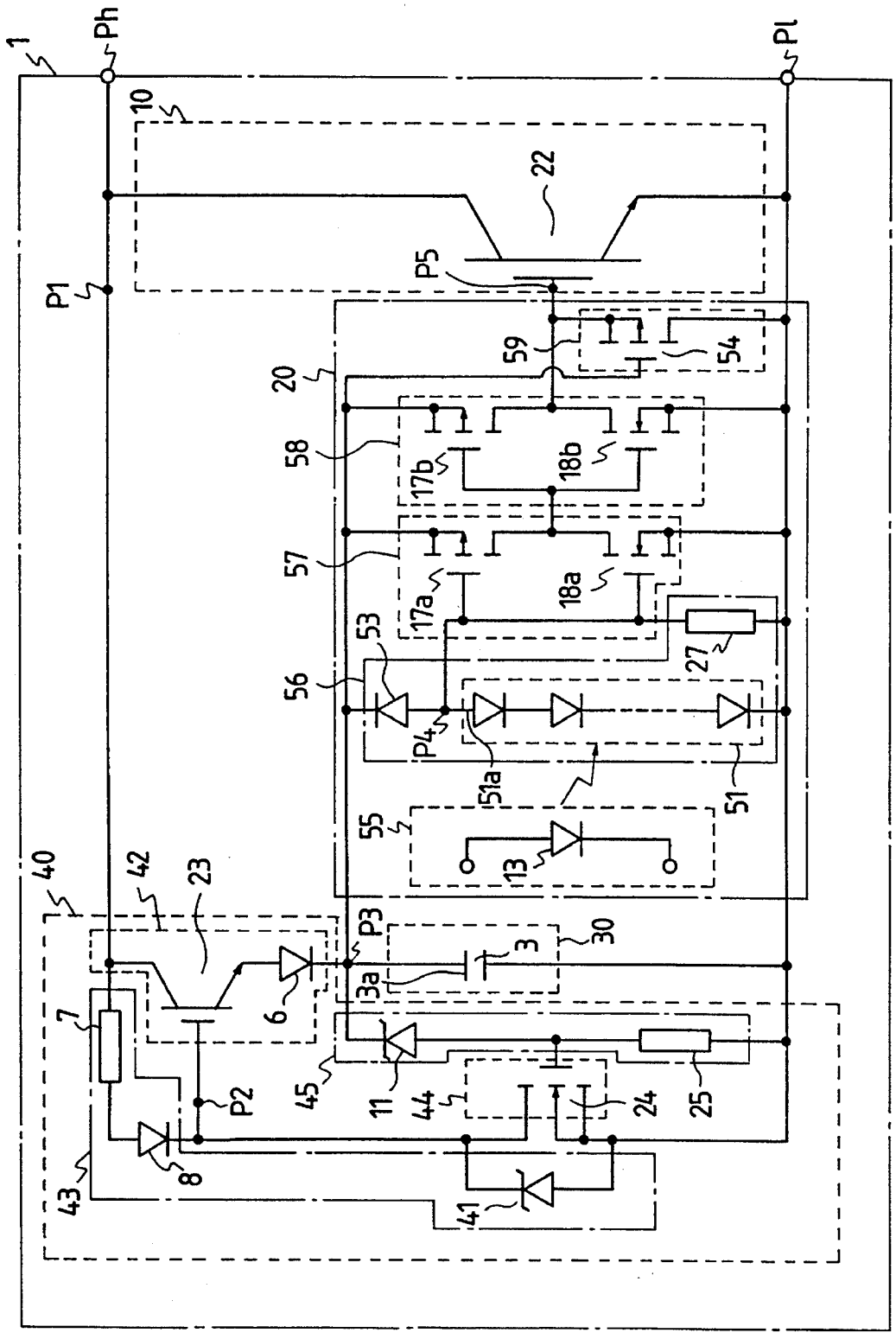
FIG. 1 is a circuit diagram showing a circuit arrangement of a built-in drive-power-source semiconductor device according to a first embodiment of the present invention.

In the built-in drive-power-source semiconductor device of the present invention, the output switch portion may be constructed with a switching element, such as a power transistor and an insulated gate semiconductor element. When high capacity and high speed switching are desired, it is preferable to use the insulated gate semiconductor element for the output switch portion.

In this case, the output switch portion is an output insulated gate semiconductor element. The output control portion is a gate drive circuit for charging and discharging the gate of the output insulated gate semiconductor element. The battery portion is a capacitor for supplying a power source to the gate drive circuit. The charging portion is a charging circuit for charging the capacitor with a voltage between the drain electrode and the source electrode of the output insulated gate semiconductor element. The charging circuit includes a charging semiconductor element and a reverse current blocking diode connected in series between the drain electrode and the capacitor, and a resistor and a first constant voltage diode connected in series between the drain electrode and the source electrode. The anode of the first constant voltage diode is connected to the source electrode of the output insulated gate semiconductor element, and the cathode of the first constant voltage diode is connected to the gate of the charging semiconductor element and the resistor. The charging circuit includes a shortcircuiting semiconductor element connected at the gate to the high potential side of the capacitor through a second constant voltage diode, which switches according to the voltage across the capacitor, and shortcircuits at least a part of the first constant voltage diode when the semiconductor element is conductive.

The shortcircuiting semiconductor element may be an NPN transistor having its base is connected to the anode of the second constant voltage diode. Alternatively, the shortcircuiting semiconductor element may be an insulated gate semiconductor element. In this case, the anode of the second constant voltage diode is connected through a resistor to the source electrode of the shortcircuiting insulated gate semiconductor element, and the cathode of the second constant voltage diode is connected to the gate of the shortcircuiting insulated gate semiconductor element.

In the present invention, as described above, the charging operation of the charging portion can be forcibly terminated. Therefore, the reference charge potential applied to the charge switch means may be selected so as to increase its charging capability. An insulated gate semiconductor element having a gate to which the reference charge potential is applied, for example, operates as a charge switch means for terminating the charging operation at a charge potential prescribed by the reference charge potential. When the charge potential of the battery portion reaches a prescribed potential, the insulated gate semiconductor element must be opened in the conventional device. Therefore, because the difference between the potential of the battery portion and the reference charge potential cannot be large, insufficient charging results. In contrast, with the charge switch means in the semiconductor device of the present invention, the battery portion can be charged to a prescribed charge potential. Accordingly, the charging capability of the charge switch means can be improved by applying a sufficiently high reference charge potential to the insulated gate semiconductor element.

The charge termination means may be an off-switch circuit operating such that when the charged potential reaches a prescribed potential, the constant voltage output means is bypassed upon a determination by the charged-potential determining circuit, in order to pull the reference charge potential up or down to the potential at which the insulated gate semiconductor element charge switch means is opened.

When the charging potential is not yet sufficient, the output switch portion is forcibly rendered inoperative by means of the disabling means, thereby preventing the erroneous operation of the output switch portion resulting from an insufficient charge potential. When the output switch portion is constructed with the insulated gate semiconductor element, a comparator or a switching element is preferably used as a disabling means to pull the gate potential up or down so that the insulated gate semiconductor element is opened when the charge potential of the battery portion does not reach a prescribed charging potential.

When a light output control portion is used, light from the emitting means causes the photo-voltage generating means to generate charge in response to the light. The voltage drop across the battery portion may be minimized by supplying the generated charge to the battery portion. Therefore, even when the output switch portion is not used for a long time, the photo voltage generating means can compensate for the voltage drop across the battery portion caused by the leakage current.

In the arrangement of the present invention, in a case where a capacitor is used for the battery portion, the charge potential across the capacitor is determined by a charge potential determining circuit comprising a second constant voltage diode. At a point during the charging operation, when the capacitor voltage increases to reach a value prescribed by the constant voltage value of the second constant voltage diode, an off-switch circuit, comprising a shortcircuiting semiconductor is used to terminate charging. When the capacitor voltage reaches the prescribed value, the shortcircuiting semiconductor element turns on and wholly or partially shortcircuits the first constant voltage diode. As a result, the gate potential of the charging semiconductor element is reduced to lower the gate-source potential of the charging semiconductor element below its threshold value. In this way, the charging semiconductor element is forcibly rendered inoperative, thereby stopping the operation of charging the capacitor. Accordingly, even when the on-duty of the output insulated gate semiconductor element is large and the rest period is short, the drive power source voltage for the drive circuit can be kept at a prescribed value. The preferred embodiments of the present invention will be described with reference to the accompanying drawings.

1st Embodiment

FIG. 1 is a circuit arrangement of a built-in drive-power-source semiconductor device according to a first embodiment of the present invention. The built-in drive-power-source semiconductor device 1 of the present embodiment uses an IGBT 22 and is designed as a high speed switching device for handling a large current. The semiconductor device is made up of an output switch portion 10 including the IGBT 22, an output control portion 20 for operating the output switch portion 10, a battery portion 30 for supplying a drive power source to the output control portion 20, and a charging portion 40 for charging the battery portion 30.

The output control portion 20 of the semiconductor device 1 functions to electrically disconnect a control circuit of a control unit for controlling the semiconductor device 1 from the semiconductor device 1, and to prevent the transmission of noise to the control unit. To this end, the output control portion 20 comprises a light emitting circuit 55 including an LED 13, a photo voltage generating circuit 56 for generating a photo voltage in response to light from the light emitting circuit 55, inverters 57 and 58 for amplifying the photo voltage received and applying the amplified voltage to the IGBT 22 as an output control signal, and a disabling circuit 59 for resetting the output control signal to a low value, when the voltage to drive the output control portion 20 is below a prescribed potential Vth, in order to disable the IGBT 22.

The photo voltage generating circuit 56 of the present embodiment uses a photo diode array 51 for generating photo voltage in response to light from the LED 13. When the LED 13 emits light, the diode array is capable of generating photo voltage V5. Since the high potential electrode 51a of the photo diode array 51 is connected to the gate electrodes of MOSFETs 17a and 18a, those MOSFETs cooperate to form the inverter 57, which is supplied with drive power from the battery portion 30. The gate electrodes of the MOSFETs 17a and 18a are coupled with a load terminal P1 connected through a resistor 27 to the low potential side of a load. With this connection, when the LED 13 emits light, a photo voltage is generated, so that the input of the inverter 57 is at high potential, and the input of the inverter 58 which receives the output signal of the inverter 57 is at low potential. Accordingly, the output of the inverter 58 becomes high in potential and the IGBT 22 coupled with the output of the inverter 58 becomes conductive. In the semiconductor device of the present embodiment, when the LED 13 emits light and the photo diode array 51 generates photo voltage, the IGBT 22 is driven by the inverters 57 and 58. Accordingly, even when the photo voltage from the photo diode array 51 is not large and fails to drive the IGBT 22, power large enough to charge the gate electrode of the IGBT 22 can be supplied from the battery portion 30. Therefore, a very high speed switching operation can be performed. The high potential side 51a of the photo diode array 51 is connected also to the high potential electrode 3a of the capacitor 3, through a diode 53. Therefore, when the LED 13 emits light, current can be supplied to the battery portion 30 by the photo voltage of the photo diode array 51.

When the LED 13 is turned off, the photo diode array 51 generates no photo voltage, so that low potential is applied to the input of the inverter 57 through the resistor 27. Accordingly, the output of the inverter 58 becomes low in potential and the IGBT 22 is opened.

The disabling circuit 59 is contained in the output control portion 20. The disabling circuit 59 includes a P-channel MOSFET 54 having a gate electrode which receives a high potential from the battery portion 30. The source electrode of the P-channel MOSFET 54 is connected to the load terminal P1 serving as a low potential terminal, and the drain electrode of the MOSFET 54 is connected to the gate electrode of the IGBT 22. With the connection of the MOSFET, when the potential of the battery portion 30 is below the threshold voltage Vth of the P-channel MOSFET 54, the MOSFET 54 is in a conductive state and the gate potential of the IGBT 22 is fixed at low potential. Accordingly, even if the potential of the battery portion 30 is insufficient to drive the inverters 57 and 58, the gate potential of the IGBT 22 is fixed at a low potential, thereby avoiding an open-collector state of the transistor. Therefore, when the potential of the battery portion 30 is low, the IGBT 22 is set in an open state. Accordingly, even if an abrupt potential variation occurs in the load of the IGBT 22, the IGBT 22 will not be turned on. When the battery portion 30 has been charged up to the required potential and is now high, the P-channel MOSFET 54 is in an off state. In this state, it will have no influence on the gate potential of the IGBT 22. When the battery portion 30 is at high potential, the P-channel MOSFET 54 is in an off state. Therefore, the charge stored in the battery portion 30 is not discharged therefrom through the P-channel MOSFET 54. Thus, when the power source of the battery portion 30 is charged sufficiently, the disabling circuit 59 has no influence on the semiconductor device.

In the built-in drive-power-source semiconductor device of the present embodiment, power is supplied to the output control portion 20 from the battery portion 30 using the capacitor 3 as a battery means. The battery portion 30 is charged through the charging portion 40 from a load circuit, which is connected to the output terminals Ph and Pl of the semiconductor device 1. The charging portion 40 of the present embodiment comprises a charge switch circuit 42 for supplying current from the load circuit to the battery portion 30, a constant voltage circuit 43 for generating a reference charge potential V2 to control the charge switch circuit 42, a charge-potential determining circuit 45 for determining the potential of the battery portion 30, and an off-switch circuit 44 for changing the reference charge potential V2 on the basis of the determination by the charged-potential determining circuit 45.

The charge switch circuit 42 includes a charging IGBT 23 which is connected at the collector to the load terminal Ph also connected to the high potential side of the load circuit. The emitter of the charging IGBT 23 is connected to the high potential electrode 3a of the battery portion 30, through the reverse current blocking diode 6- Accordingly, if the charging IGBT 23 is conductive, the capacitor 3 is charged. The constant voltage circuit 43 for controlling the gate potential of the charging IGBT 23 comprises a resistor 7, a reverse current blocking diode 8, and a first constant voltage diode 41, which are arranged in this order from the load terminal Ph. The first constant voltage diode 41 can provide a constant voltage V2, and the high potential side of the diode 41 is connected to the gate electrode of the charging IGBT 23. Accordingly, when a voltage V1, having a potential in excess of a predetermined constant voltage V2, is applied to the diode 41 and the constant voltage circuit 43, the gate of the charging IGBT 23 is kept at the constant voltage V2. If the constant voltage V2 is equal to or greater than the threshold voltage of the charging IGBT 23, the charging IGBT 23 is conductive, and the charging operation starts. As in the charging MOSFET 5 in the prior art, it is desirable to increase the difference between the gate potential and the emitter potential of the charging IGBT 23, in order to increase the charging current to thereby reduce the charging time. In the present embodiment, the constant voltage V2 is set to be sufficiently large.

Thus, when the constant voltage V2 applied to the charging IGBT 23 is high, it is necessary to stop the charging operation when the charged potential of the battery portion 30 reaches a prescribed voltage, so that an IGBT of the same ratings as those of the charging IGBT 23 can be used in the output control unit. To this end, the charged-potential determining circuit 45 and the off-switch circuit 44 are used in the built-in drive-power-source semiconductor device of the present embodiment. In the present embodiment, the charged-potential determining circuit 45 includes a second constant voltage diode 11 connected to the high potential side of the battery portion 30 and a resistor 25 connected between the diode 11 and the low potential load terminal Pl. The off-switch circuit 44 consists of a shortcircuiting MOSFET 24 of the N-channel type which receives the electrode potential generated across the resistor 25 in the charged-potential determining circuit 45 at its gate. The shortcircuiting MOSFET 24 is connected in parallel to the first constant voltage diode 41. The second constant voltage diode 11 operates to conduct current when the potential of the battery portion 30 exceeds a prescribed potential V5. Therefore, when the potential of the battery portion 30 exceeds the prescribed potential V5, the gate potential of the shortcircuiting MOSFET 24 is higher than its source potential. Under this condition, the shortcircuiting MOSFET 24 becomes conductive and forms a circuit which bypasses the first constant voltage diode 41. As a result, the gate potential of the charging IGBT 23 is pulled down to low potential, so that the charging IGBT 23 is opened and the operation of charging the battery portion 30 ends.

Figure 2:
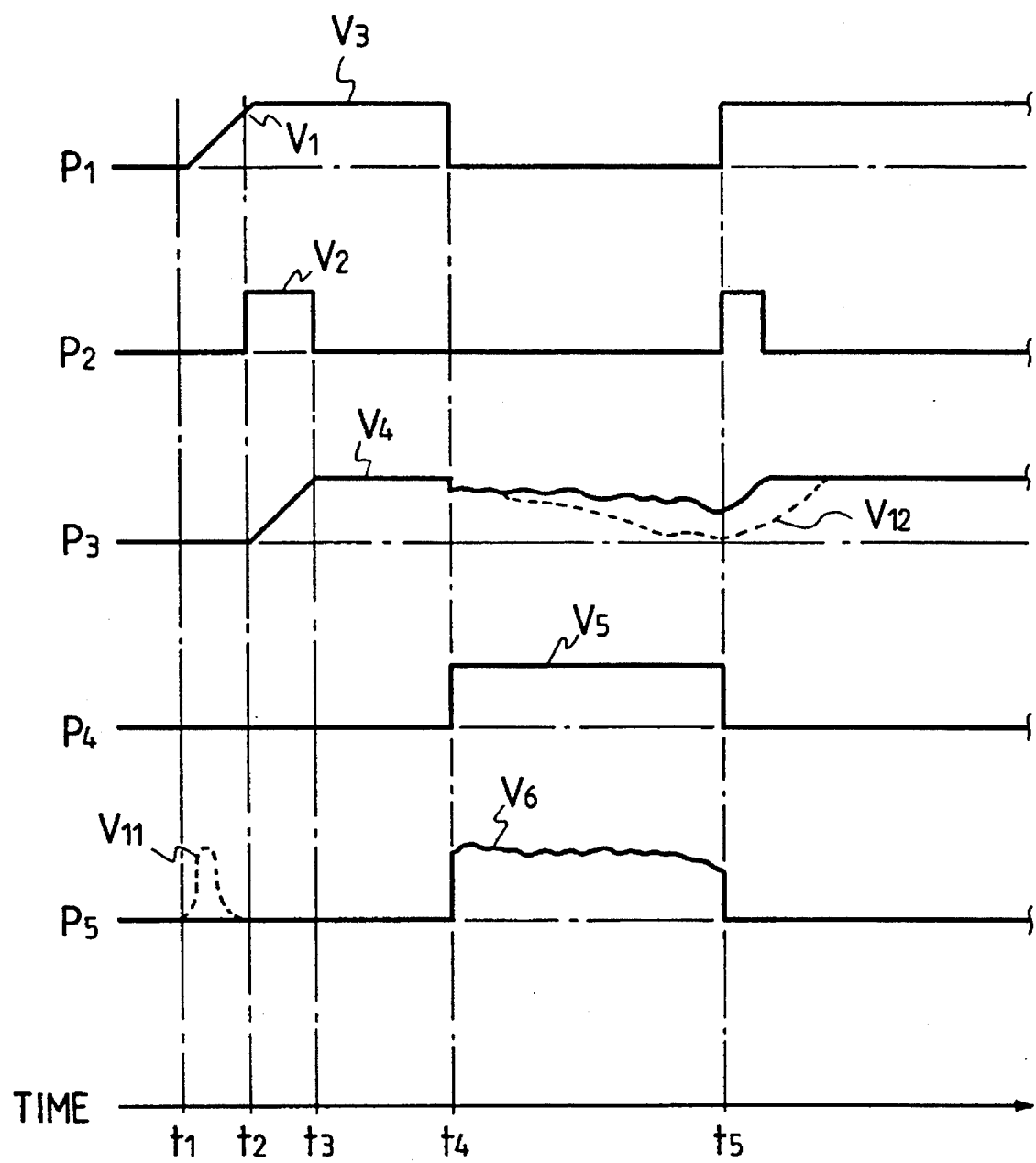
FIG. 2 is a timing chart useful in explaining the operation of the built-in drive-power-source semiconductor device shown in FIG. 1.

The operation of the built-in drive-power-source semiconductor device thus arranged will be described with reference to FIG. 2 which shows potential variations at key points in the semiconductor device. In FIG. 2, reference character P1 indicates potential applied to the load terminals Ph and Pl; P2 indicates gate potential of the charging IGBT 23; P3 indicates potential at the high potential side of the battery portion 30; P4 indicates photo voltage generated by the photo diode array 51; and P5 indicates gate potential of the output IGBT 22.

At time t1, a switch in the load is turned on, so that a potential difference appears between the load terminals Ph and Pl. If the load terminal Pl is grounded, potential V3 appears at the load terminal Ph in an open state of the output switch portion 10. With a voltage changing at a rate of dV/dt when the load power source rises, current flows through the collector-gate capacitance of the IGBT.

At this time, the required potential across the capacitor 3 has not been reached. Accordingly, the inverter 58 is in a high impedance state. If the disabling circuit 59 is not used, the gate potential P5 of the IGBT rises as indicated by a curve V11, and the IGBT 22 is temporarily conductive. It is noted that in the present embodiment, the disabling circuit 59 is used. Therefore, when the required potential across the capacitor 3 has not been reached, the gate potential P5 is fixed at the low potential. Thus, the temporary conduction state of the IGBT, as indicated by the curve V11, will not occur.

At time t2, the potential P1 at the load terminal is equal to the potential V1, and the gate potential P2 of the charging IGBT 23 reaches a prescribed charging potential V2. Under this condition, the charging IGBT 23 becomes conductive, and the operation of charging the capacitor 3 starts. At time t3, the potential P3 of the capacitor 3 reaches a prescribed potential V4. Then, the second constant voltage diode 11 becomes conductive and the shortcircuiting MOSFET 24 is turned on. Accordingly, the gate potential P2 becomes low and the charging IGBT 23 is turned off.

In a situation in which the capacitor 3 has been charged as described above, the LED 13 receives a control signal at time t4 and emits light. In response to the emitted light, photo voltage appears at the high potential side P4 of the photo diode array 51. The photo voltage drives the inverters 57 and 58 depending on the potential stored in the capacitor 3, so that the gate potential P5 of the IGBT 22 is pulled up to the high potential. Accordingly, the IGBT 22 becomes conductive and the load potential P1 drops.

The potential P3 of the capacitor 3 drops since it has driven the inverters 57 and 58 and charged the gate electrode of the IGBT 22.

The reverse-current blocking diode 6 is provided to prevent the reduction of the potential of the capacitor 3. However, current leakage from the inverters 57 and 58 causes a gradual reduction in the potential. When the IGBT remains turned on for a long time, the potential P3 of the capacitor 3 drops as indicated by a curve V12. As a result, the next charging time may require an undesirably large amount of time or the potential may drop below the threshold value of the IGBT 22. However, in the instant embodiment, the photo voltage V5 generated by the photo diode array 51 is supplied to the capacitor 3. Thus, the reduction of the potential P3 of the capacitor 3 is checked. Therefore, the charging time of the next charging operation can be reduced and the potential will not drop below the threshold value of the IGBT 22.

At time t5, when the LED 13 is turned off in response to a control signal, the photo diode array 51 produces no photo voltage, the output potential of the inverter 58 becomes low, and the IGBT 22 is turned off. Accordingly, the potential P1 at the load terminal returns to the high potential, so that the gate potential P2 of the charging IGBT 23 is set at the charging potential V2. In the conventional semiconductor device, the potential of the capacitor 3 is determined by the charging potential V2. For this reason, it is impossible to set the charging potential V2 at a high potential. In contrast, in the semiconductor device of the present invention, when the potential of the capacitor 3 reaches a prescribed potential V4, the charged-potential determining circuit 45 and the off-switch circuit 44 operate to automatically stop the charging operation. Therefore, the charging potential V2 may be set at very high potential. Under the high charging potential, the charging current fed to the capacitor 3 may be kept up at a high value. Consequently, the charging operation requires a shorter time, enabling the device to be ready for the next incoming control signal.

As described above, even when the on-time of the semiconductor device is long, resulting in a high demand on the battery portion, a sufficiently high drive voltage can be obtained from the battery portion. Accordingly, the loss in the output IGBT is small and the reliability of the switching operation is high. At the same time, in the present invention, the photo voltage generated by the photo diodes is used to compensate the battery portion for leakage current. Therefore, the drive voltage necessary for the switching operation can be ensured. Further, even when the load is connected to the semiconductor device, if the required drive voltage has not yet been reached, the operation of the output IGBT is disabled, thereby preventing erroneous operation. Thus, the built-in drive-power-source semiconductor device of the present invention has a low power loss and a high reliability. In the semiconductor device of the present invention, the above goals can be achieved with a device employing the battery portion drive voltage of the conventional semiconductor device. Accordingly, it is not necessary to use circuit elements having high rating values in the output control portion. As a result, the cost of the device is reduced.

2nd Embodiment

Figure 3:
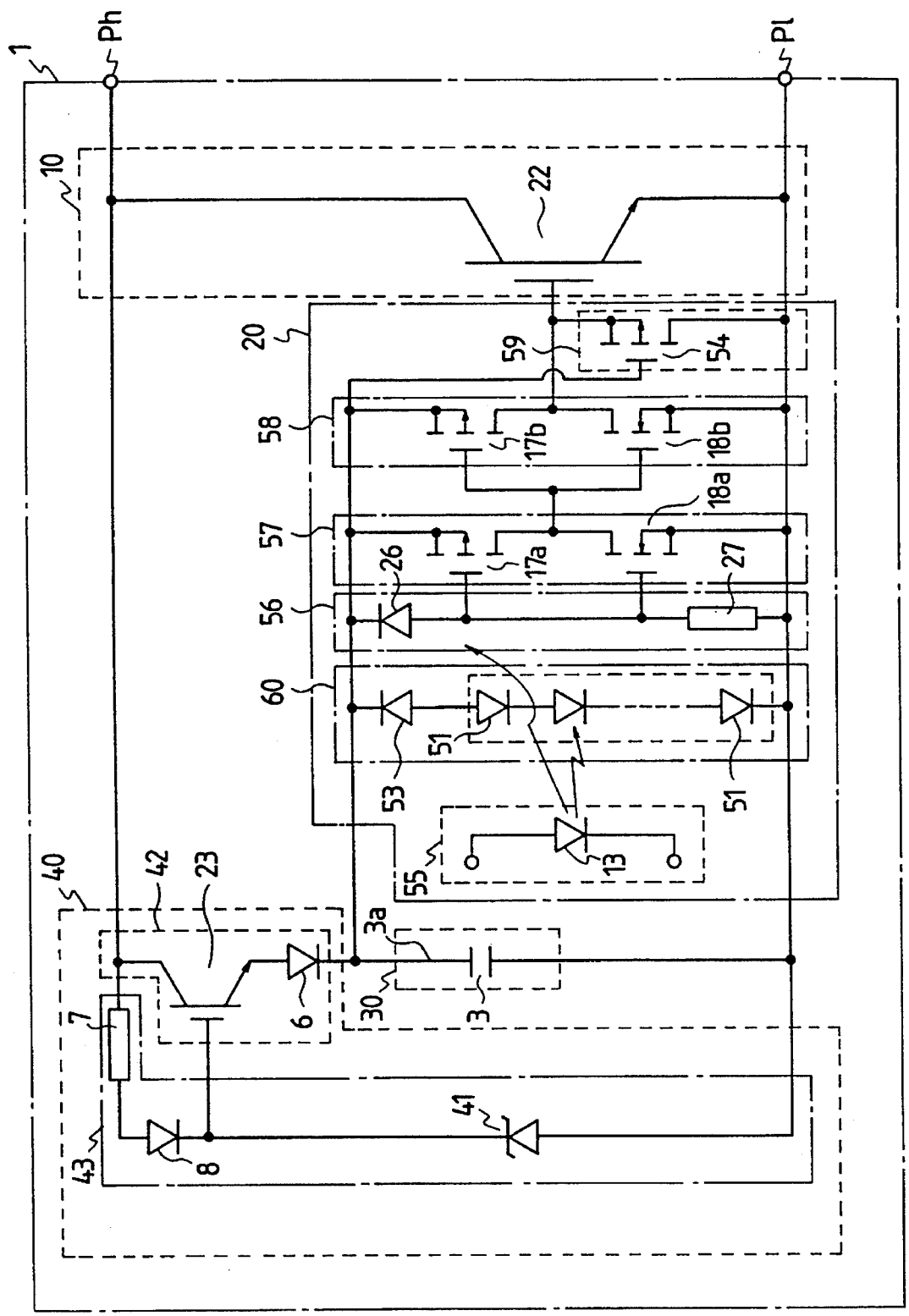
FIG. 3 is a circuit diagram showing a circuit arrangement of a built-in drive-power-source semiconductor device according to a second embodiment of the present invention.

FIG. 3 is a circuit diagram showing an arrangement of a built-in drive-power-source semiconductor device according to a second embodiment of the present invention. The built-in drive-power-source semiconductor device of the second embodiment, like that of the first embodiment, uses an IGBT 22 and is designed as a high speed switching device for handling a large current. The semiconductor device is made up of an output switch portion 10 including the IGBT 22, an output control portion 20 for operating the output switch portion 10, a battery portion 30 for supplying a drive power source to the output control portion 20, and a charging portion 40 for charging the battery portion 30. In the figure, like or equivalent portions are designated by like reference numerals and characters in the drawings for the first embodiment, for simplicity.

It is noted that the second embodiment uses two photo voltage generating circuits; a photo voltage generating circuit 56 for controlling the inverters 57 and 58 in response to light from the LED 13, and a photo voltage generating circuit 60 for charging the battery portion 30 including the capacitor 3. The photo voltage generating circuit 56 includes a photo diode 26 and a resistor 27 connected between the high potential electrode of the photo diode 26 and the load terminal P1 serving as a low potential terminal.

The high potential electrode of the photo diode 26 is connected to the input of the inverter 57. As in the first embodiment, when the LED 13 is turned on, causing the photo diode 26 to generate photo voltage, high potential appears at the input of the inverter 57 and low potential appears at the input of the inverter 58. Accordingly, the gate potential of the output IGBT 22 becomes high, so that the built-in drive-power-source semiconductor device is in a conductive state. The operation of the semiconductor device when the LED 13 is turned off, is also similar to that in the first embodiment, and hence no further description of it will be given.

The photo-voltage generating circuit 60 includes a photo diode array 51 and a diode 53, as in the first embodiment. The capacitor 3 is charged by the photo voltage generated when the LED 13 is emits light. In the present embodiment, the inverters 57 and 58 are controlled by the photo voltage generating circuit 56, rather than by the photo voltage generating circuit 60, thereby effectively charging the capacitor 3. Accordingly, an increased charge for the output switch portion 10 is obtained relative to that obtained by the device of the first embodiment. In this respect, the semiconductor device of the second embodiment is suitable for uses requiring a long on-time. In the semiconductor device of the present embodiment, the on-time capability is longer than that in the semiconductor device of the first embodiment. This fact implies that a longer time can be used for charging the capacitor 3. In the present embodiment, the circuit arrangement of the charging portion 40 is simplified by omitting the charged-potential determining circuit 45 and the off-switch circuit 44, which are used in the first embodiment.

In the present embodiment, the LED 13 is used for both the photo voltage generating circuit 60 and the photo voltage generating circuit 56. If required, however, individual light sources may be provided for each respective photo voltage generating circuit. As a matter of course, other suitable active elements such as, for example, photo transistors, may be used in lieu of the photo diodes as a means for generating photo voltage.

3rd Embodiment

Figure 4:
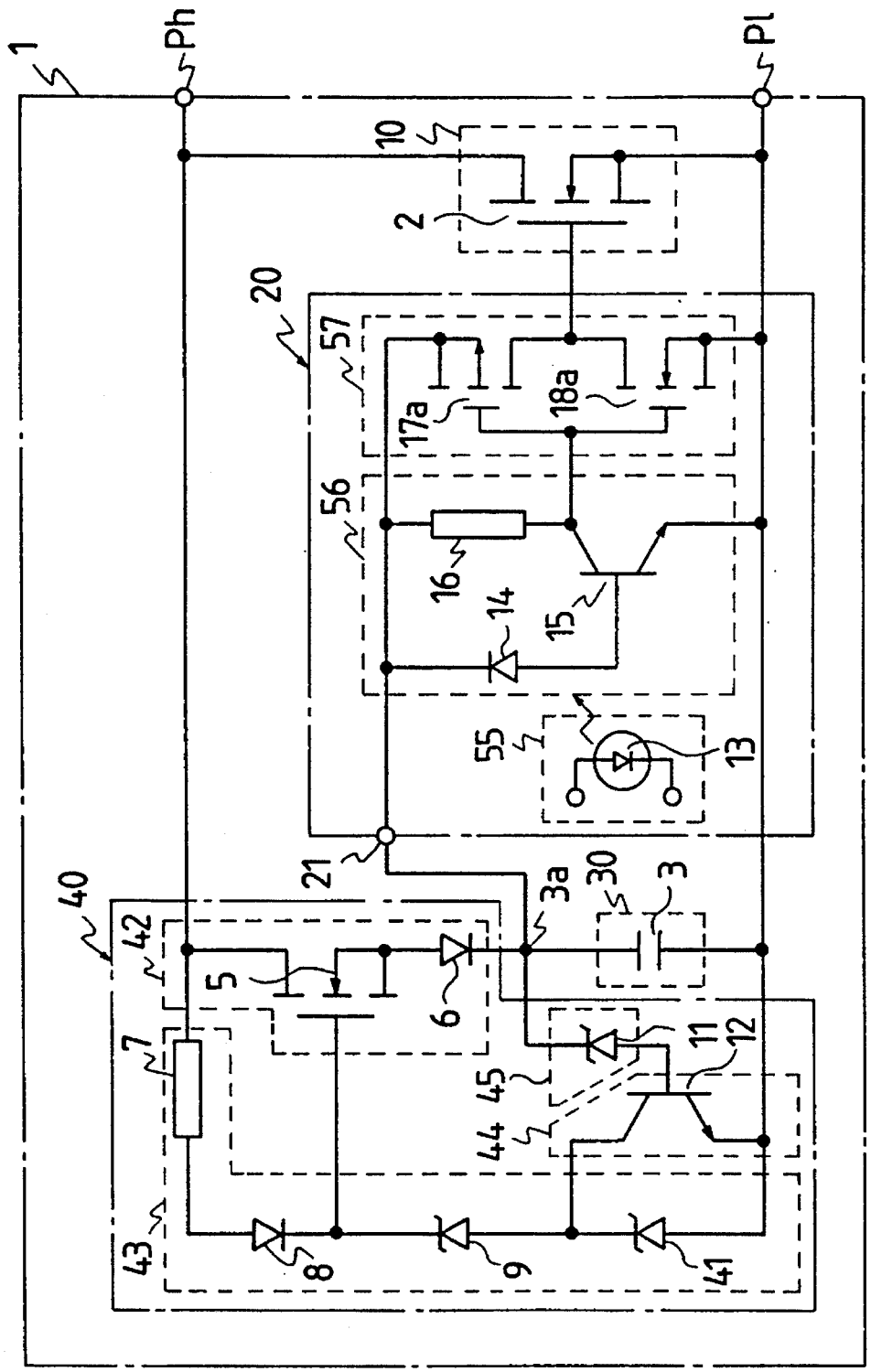
FIG. 4 is a circuit diagram showing a circuit arrangement of a built-in drive-power-source semiconductor device according to a third embodiment of the present invention.

FIG. 4 is a circuit diagram showing an arrangement of a built-in drive-power-source semiconductor device according to a third embodiment of the present invention. The built-in drive-power-source semiconductor device of the third embodiment is a high speed switching device for handling a large current, and uses an output switch portion 10 constructed with an output MOSFET 2 of the N-channel type. The semiconductor device 1, like the semiconductor device of the first embodiment, is made up of the output switch portion 10, an output control portion 20 for operating the output switch portion 10, a battery portion 30 for supplying a drive power source to the output control portion 20, and a charging portion 40 for charging the battery portion 30. In FIG. 4, like or equivalent portions are designed by like reference numerals and characters in the drawings for the first embodiment, for simplicity.

As in the first embodiment, the charging portion 40 of the semiconductor device 1, comprises a charge switch circuit 42, a constant voltage circuit 43 for generating a reference charge potential V2 to control the charge switch circuit 42, a charged-potential determining circuit 45 for determining the potential of the battery portion 30, and an off-switch circuit 44 for changing the reference charge potential V2 on the basis of the determination by the charged-potential determining circuit 45. In the present embodiment, a charging MOSFET 5 is used for the charge switch circuit 42. In the constant voltage circuit 43 of the present embodiment, a load constant voltage diode 9 is additionally connected in series to the first constant voltage diode 41, in order to set the reference charge potential V2 to be applied to the gate electrode of the charging MOSFET 5 at a higher potential. In the off-switch circuit 44, an NPN transistor 12 is used as a shortcircuiting semiconductor element 12, and is connected so as to shortcircuit the first constant voltage diode 41. The charged-potential determining circuit 45 for controlling the shortcircuiting semiconductor element 12 includes a second constant voltage diode 11 which is connected at the cathode to the high potential electrode 3a of the capacitor 3 and at the anode to the base of the shortcircuiting semiconductor element 12. The NPN transistor 12 is connected at the base to the anode of the second constant voltage diode 11, at the collector to the cathode of the first constant voltage diode 41, and at the emitter to the anode of the first constant voltage diode 41. The constant voltage across the additional constant voltage diode 9 is set to such a value as to make the gate-source voltage of the charging MOSFET 5 smaller than the gate threshold value of the charging MOSFET 5 under the condition that when the capacitor 3 is charged up to a prescribed voltage, the first constant voltage diode 41 is shortcircuited. If required, the reverse current blocking diode 8 is inserted between the current restricting resistor 7 and the gate of the charging MOSFET 5.

The operation of the charging portion 40 will be described. It is assumed now that the output MOSFET 2 is in a rest or nonconductive mode, a high voltage substantially equal to the load power source voltage is applied to between the drain and source of the output MOSFET 2, and no charge is stored in the capacitor 3. At this time, the potential at the source electrode of the charging MOSFET 5 is substantially zero (0), and the potential at the gate electrode of the charging MOSFET 5 is a high voltage determined by the sum of the voltage values of the constant voltage diode 9 and the constant voltage diode 41, both serving as the first constant voltage diode. Accordingly, the charging MOSFET 5 is conductive. The capacitor 3 is then charged in a conventional manner. In this circuit arrangement, the gate potential of the charging MOSFET 5 and hence the gate-source voltage $V_{GS}$ of the charging MOSFET 5 may be set high. This results in a large drain current $I_B$, thereby enabling reduction of the charging time of the capacitor. During charging, when the voltage across the capacitor 3 increases to exceed the constant voltage across the second constant voltage diode 11, current flows into the base of the shortcircuiting semiconductor element 12 as a result of the avalanche or tunnel effect of the diode 11, causing the shortcircuiting semiconductor element 12 to switch to a conductive mode, thereby shortcircuiting the first constant voltage diode 41. Due to the shortcircuiting of diode 41, the gate potential of the charging MOSFET 5 corresponds only to the voltage of the additional constant voltage diode 9. The gate-source voltage $V_{GS}$ of the charging MOSFET 5 falls below the threshold value causing the charging MOSFET 5 to switch to an off mode to terminate the charging operation of capacitor 3 and stop the increase in potential at the high potential electrode 3a. Accordingly, the potential at the high potential electrode 3a of the capacitor 3 is set to a fixed value which depends on the voltage across the second constant voltage diode 11.

The output control portion 20 will be described. The output control portion 20 is a gate drive circuit for the output MOSFET 2, and is based on a circuit system suitable for a high speed operation.

In the output control portion 20, reference numeral 14 designates a photo diode which is connected at the cathode to the power source receiving terminal 21 and at the anode to the base of an NPN transistor 15. The photo diode 14 is disposed so as to receive light from the LED 13 and to generate a prescribed photo voltage. The NPN transistor 15 is connected at the base to the anode of the photo diode 14, at the collector through a resistor 16 to the power source receiving terminal 21, and at the emitter to the source electrode of the output MOSFET 2. Reference numerals 17a and 18a designate a pair of inverters which cooperate in operation. The invertor 18a includes a P-channel MOSFET which is connected at the drain to the power source receiving terminal 21, at the source to the drain of the inverter 18a, and at the gate to the collector of the NPN transistor 15. The inverter 18a includes an N-channel MOSFET which is connected at the drain to the source of the P-channel MOSFET 17a, at the source to the source of the output MOSFET 2, and at the gate, together with the gate of the P-channel MOSFET 17a, to the collector of the NPN transistor 15. A nodal point between the gates of the P-channel and N-channel MOSFETs 17a and 18a, respectively, is an input point of the paired inverters 17a and 18a. A nodal point between the source electrode of the P-channel MOSFET 17a and the drain electrode of the N-channel MOSFET 18a is an output point of the paired inverters. An output signal at the output point is applied to the gate of the output MOSFET 2.

The operation of the gate drive circuit 20 will now be described. When the LED 13 is driven to emit light and the photo diode 14 generates a photo voltage, the NPN transistor 15 becomes conductive, the input of the paired inverters is at a $L_{ow}$ level, the P-channel MOSFET 17a is rendered conductive, the N-channel MOSFET 18a is rendered nonconductive, and the output of the paired inverters is at a $H_{igh}$ level. When the inverter output is at a $H_{igh}$ level, the gate of the output MOSFET 2 is charged and the MOSFET 2 is rendered conductive. When the LED 13 is turned off, the NPN transistor 15 is turned off, the inverter input is at a $H_{igh}$ level, the P-channel MOSFET 17a is rendered nonconductive, the N-channel MOSFET 18a is rendered conductive, and the inverter output is at a $L_{ow}$ level. In this case, the charge stored in the capacitor 3 is discharged through the N-channel MOSFET 18a, thereby rendering the output MOSFET 2 nonconductive.

4th Embodiment

Figure 5:
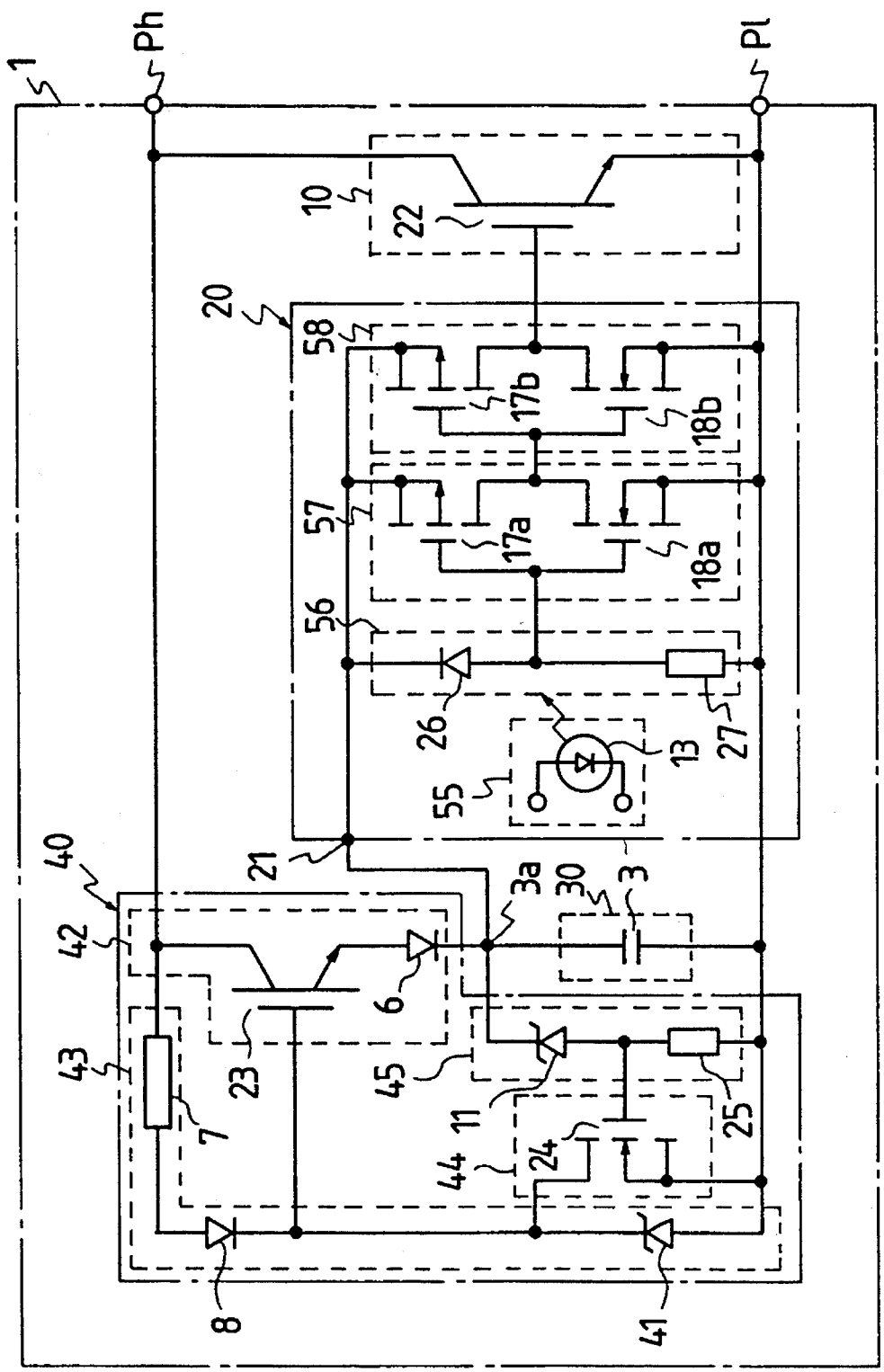
FIG. 5 is a circuit diagram showing a circuit arrangement of a built-in drive-power-source semiconductor device according to a fourth embodiment of the present invention.
Figure 6:
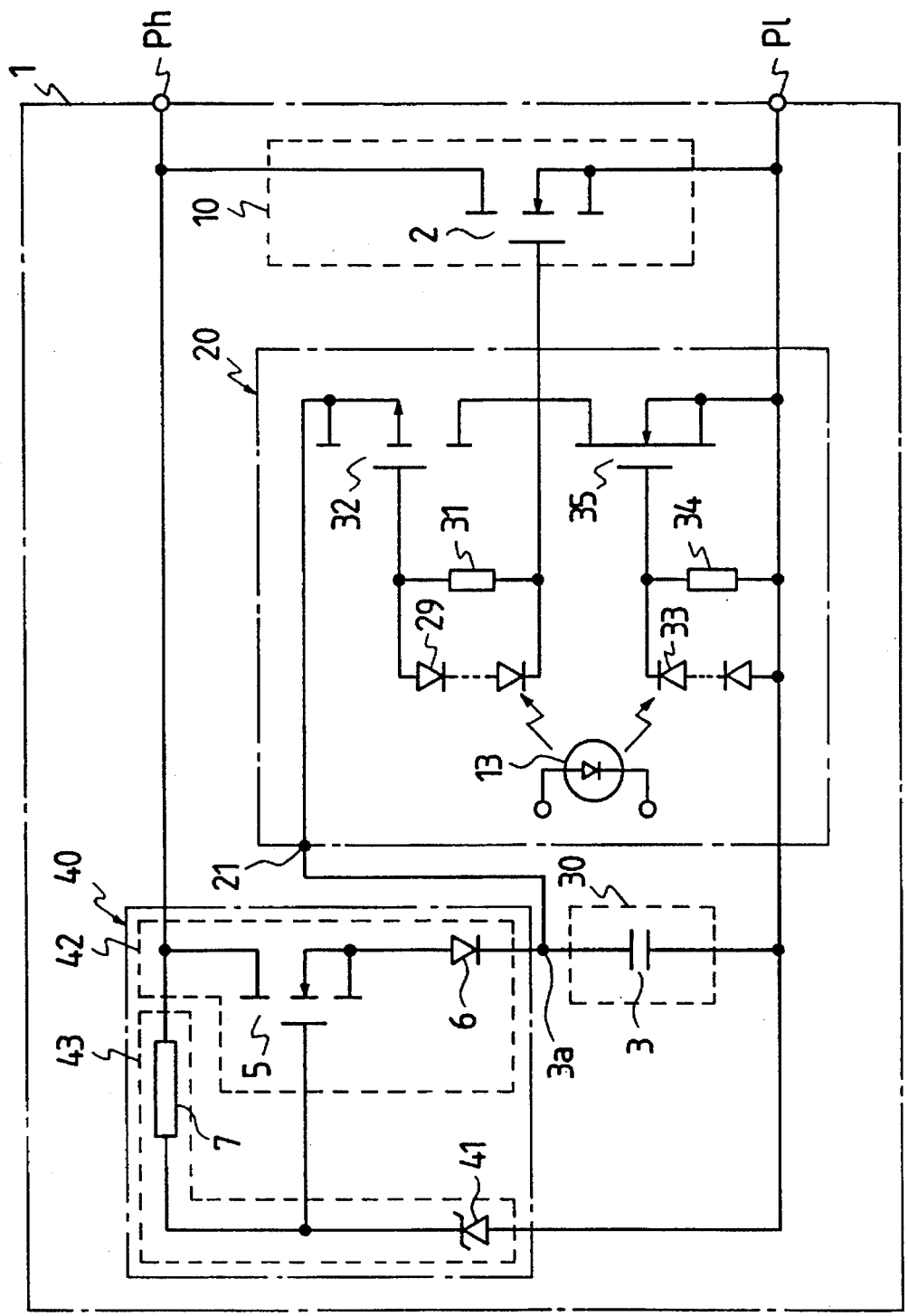
FIG. 6 is a circuit diagram showing a circuit arrangement of a conventional built-in drive-power-source semiconductor device.
Figure 7:
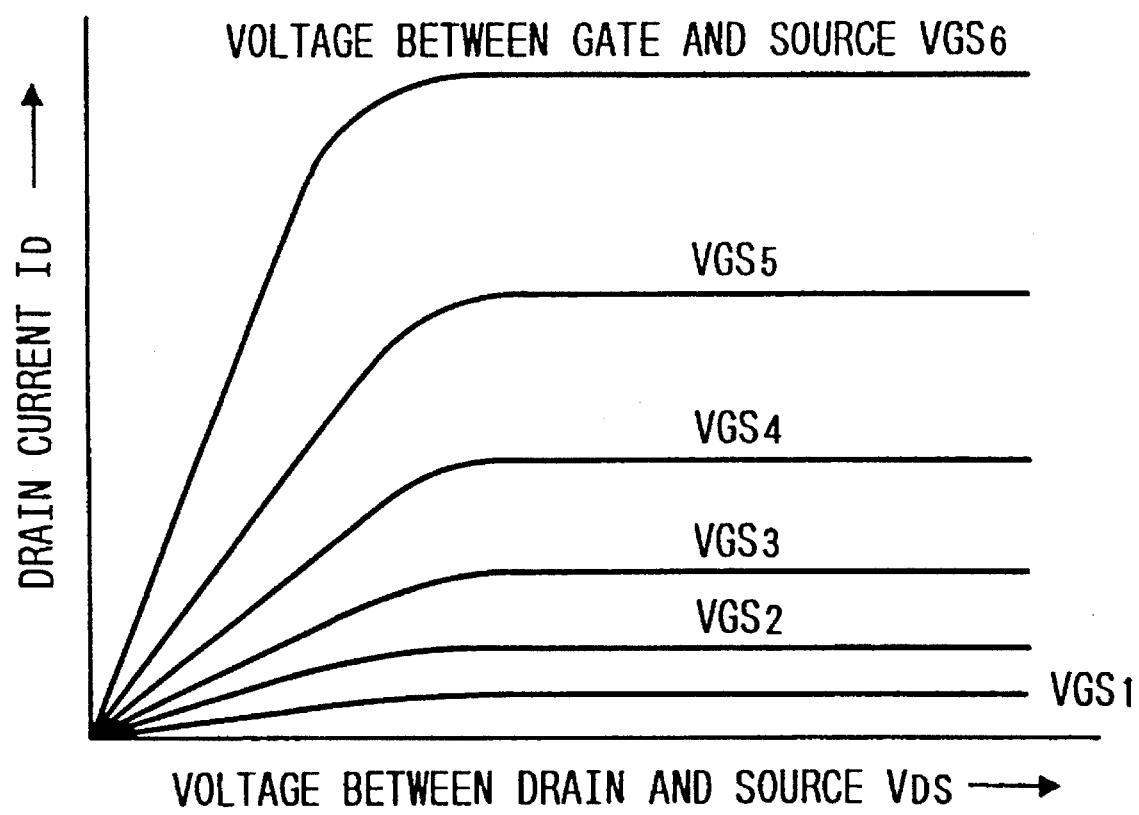
FIG. 7 is a graph showing an example of the output characteristic of the conventional built-in drive-power-source semiconductor device.

FIG. 5 is a circuit diagram showing an arrangement of a built-in drive-power-source semiconductor device according to a fourth embodiment of the present invention. The built-in drive-power-source semiconductor device of the fourth embodiment, like that of the first and second embodiments, is a high speed switching device for handling a large current, which uses an IGBT 22. The semiconductor device comprises an output switch portion 10 including the IGBT 22, an output control portion 20 for operating the output switch portion 10, a battery portion 30 for supplying a drive power source to the output control portion 20, and a charging portion 40 for charging the battery portion 30. In the figure, like or equivalent portions are designated by like reference numerals and characters in the drawings for the first embodiment, for simplicity.

The semiconductor device of the present embodiment is different from the semiconductor device shown in FIG. 4 in that the output IGBT 22 is used as the output insulated gate semiconductor element, a charging IGBT 23 is used as the charging semiconductor element of the charging portion 40, and a shortcircuiting MOSFET 24 is used as the shortcircuiting semiconductor element. Additionally, a resistor 25 is provided. This resistor provides a gate potential necessary for rendering the shortcircuiting MOSFET 24 conductive when the voltage applied to the second constant voltage diode 11 exceeds a prescribed value and a current flows. In spite of the differences stated above, the circuit operation of the fourth embodiment is essentially equal to that of the circuit of FIG. 4. In the embodiment shown in FIG. 5, the constant voltage diode 9, constituting part of the first constant voltage diode shown in FIG. 4, is not used. The reason for this is that if a diode of a sufficiently high constant voltage is used for the first constant voltage diode, only the first constant voltage diode 41 is necessary for circuit operation. The stray capacitance of the shortcircuiting MOSFET 24 is available for the constant voltage diode 41, if required.

The output control portion 20 is substantially the same as that of the first or second embodiment, but is different from that of the third embodiment. A photo voltage generating circuit 53 includes a photo diode 26 disposed so as to generate a prescribed photo voltage in response to light received from an LED 13 of light emitting circuit 55, and a resistor 27 for applying an input signal having a $H_{igh}$ level to an input point of a first stage inverter 57, which includes a P-channel MOSFET 17a and an N-channel MOSFET 18a, when a photo voltage is generated in the photo diode 26. A second stage inverter 58 includes a P-channel MOSFET 17b and an N-channel MOSFET 18b. Like the MOSFETs of the first stage inverter 57, in the second stage inverter 58, MOSFETs 17b and 18b cooperate in operation. The output signal of the second stage inverter 58 is applied to the gate of the output IGBT 22. In a semiconductor device of the present embodiment, if dV/dt is not large, and the on-time of the output IGBT 22 is not long, the disabling circuit and the charging circuit using the photo voltage may be omitted, simplifying the circuit arrangement.

The operation of the output control portion 20 in the present embodiment will be described. When the photo diode 26 receives light from the LED 13, the input of the second stage inverter 58 becomes low. Accordingly, the P-channel MOSFET 17b is rendered conductive, and the N-channel MOSFET 18b is rendered nonconductive and its output becomes high. Thus, the output of the output control portion 20 becomes high and the output of IGBT 22 is made conductive. When the LED 13 is turned off, the input of the second stage inverter 58 becomes high, the P-channel MOSFET 17b is made nonconductive, and the N-channel MOSFET 18b is made conductive and its output becomes low. Consequently, the output of the output control portion 20 becomes low and the output IGBT 22 is made nonconductive.

In the embodiments of the invention thus far described, the MOSFET or IGBT is used as the output insulated gate semiconductor element in the output switch portion 10. Another type of semiconductor device, for example, an insulated gate semiconductor element such as an MOS-controlled thyristor (MCT), may be used for the output insulated gate semiconductor element. In addition to the insulated gate semiconductor element, a bipolar semiconductor element such as a power transistor may also be used for the same purpose. Further, an appropriate combination of semiconductor elements may be used for forming the output switch portion.

In the embodiments thus far described, the opto-isolation type output control means used an LED as a signal source. Alternatively, an opto-isolator such as a photo coupler may be used. In a case where isolation from the control signal is not necessary, the output control portion may be controlled directly by an externally applied control signal.

As described above, the reverse-current blocking diode is connected in series with the current restricting resistor between the drain and gate of the charging semiconductor element in the constant voltage setting circuit. The reverse-current blocking diode is provided for blocking the reverse flow of the charge stored in the gate of the charging semiconductor element when the output switch portion is rendered conductive and the voltage applied to the load terminal becomes low. In a case where the switching period of the output switch portion is satisfactorily short and the resistance of the current restricting resistor is sufficiently large, the reverse-current blocking diode may be omitted.

In the aforementioned embodiments, a PIN diode, avalanche photodiode (APD) or the like may be used for the photo diode, if required. It should be understood that the circuit arrangements mentioned above are for illustrative purpose only, and various other circuit arrangements may be used according to the uses and conditions of the semiconductor device.

As described above, the built-in drive-power-source semiconductor device of the invention includes a charge termination means for stopping the charging operation carried out by the charging means in accordance with the charge potential of the battery means. Accordingly, the reference charge potential applied to the charge switch means may be set to a high potential without the risk of overcharging, so that the current fed from the charging means to the battery means is increased, and the battery can be charged in a shorter period of time. Further, in a case where the on-duty is high, the stability of the power supplied to the output switch means can be ensured. Furthermore, the loss at the time of switching may be reduced, leading to a more reliable switching operation. Since the charge potential of the battery means of the present invention is on the order of that used in the conventional device, the output control means may be designed to conventional specifications. Thus, the built-in drive-power-source semiconductor device of the present invention exhibits low switching loss, high reliability, and low cost.

The disabling means prevents erroneous operation of the output switch means when the battery means has not yet been charged to the required charge potential, thereby improving the reliability of the switching operation.

When an output control means of a light insulation type is employed, the battery portion can be charged by photo voltage generated by the photo voltage generating means when the light emitting means emits light in response to an input control signal. With this feature, voltage drop in the battery means, which is caused by the leakage current, can be checked. Therefore, even when the output switch means remains on for a long time, the erroneous switching operation caused by the voltage drop will not occur. The resultant reduction of the charging time further improves the switching operation.

In a case in which a capacitor is used for the battery means, when the voltage across the capacitor is lower than a predetermined voltage value, the charging operation may be terminated for a short time in order to apply a sufficiently high voltage to the gate of the charging semiconductor element, thereby increasing the drain current of the charging semiconductor element. When the capacitor is charged to a predetermined value, as indicated by the second constant voltage diode of the charge potential determining means, the charging operation is stopped by the shortcircuiting semiconductor element of the off-switch means, which shortcircuits at least part of the first constant voltage diode constituting the constant output voltage means, thereby lowering the gate potential of the charging semiconductor element and turning it off. Therefore, even in the case of a semiconductor device having a long on-time and a short nonconductive period, the drive power source voltage for driving the output switch portion can be kept at a prescribed value. Further, the loss generated in the output insulated gate semiconductor element can be minimized. Since charging of the capacitor can be terminated at the initial stage of the turn-off operation of the output insulated gate semiconductor element, it is possible to check the loss generated in the charging semiconductor element. Since the use of high breakdown voltage elements in the output switch means and output control means is not necessary, a built-in drive-power-source semiconductor device of high reliability and low cost can be realized.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A built-in drive-power-source semiconductor device comprising:

output switch means for switching power between first and second terminals of a circuit external to said semiconductor device;

output control means for controlling said output switch means in response to an input control signal;

battery means for supplying drive power to said output control means;

charging means for charging said battery means from said circuit external to said semiconductor device, said charging means including:

constant voltage output means, connected to said external circuit, for providing a charge reference potential, charge switch means for conducting charge current to said battery means from said external circuit in response to said charge reference potential, means for generating a predetermined charge potential level, and charge termination means, coupled to said means for generating said predetermined charge potential level, for turning off said charge switch means when a charge potential of said battery means reaches said predetermined charge potential level.

2. The built-in drive-power-source semiconductor device according to claim 1, wherein:

said charge switch means includes an insulated gate semiconductor element for conducting said charge current, said insulated gate semiconductor element including a gate receiving said charge reference potential as a gate potential for turning on said semiconductor element, and said charge termination means includes means for determining the charge potential of said battery means, and off-switch means, connected to said gate of said insulated gate semiconductor element, for shortcircuiting said constant voltage output means when said determined charge potential of said battery means reaches said predetermined level, for setting said charge reference potential to a level sufficient to turn off said semiconductor element.

3. The built-in drive-power-source semiconductor device according to claim 1, wherein said output switch means includes an output insulated gate semiconductor element.

4. The built-in drive-power-source semiconductor device according to claim 3, wherein:

said output control means includes gate drive means for charging and discharging a gate of said output insulated gate semiconductor element, said battery means includes a capacitor for supplying power to said gate drive means, said charge switch means includes a charging semiconductor element and a reverse current blocking diode coupled between a drain electrode of said output insulated gate semiconductor element and said capacitor for charging said capacitor with a voltage from across the drain electrode and a source electrode of said output insulated gate semiconductor element, said constant voltage output means includes a resistor and a first constant voltage diode coupled in a path between said drain electrode and the source electrode of said output insulated gate semiconductor element, an anode of said first constant voltage diode being connected to the source electrode of said output insulated gate semiconductor element, and a cathode of said first constant voltage diode being coupled to a gate of said charging semiconductor element and to one end of said resistor, the other end of said resistor being connected to said drain electrode of said output insulated gate semiconductor element, and said charge termination means includes a shortcircuiting semiconductor element, having a gate coupled to a high potential side of said capacitor through a second constant voltage diode generating said predetermined charge potential level, for shortcircuiting the current flowing through said first constant voltage diode when the voltage across said capacitor reaches said predetermined charge potential level.

5. The built-in drive-power-source semiconductor device according to claim 4, wherein said shortcircuiting semiconductor element includes an NPN transistor, and the anode of said second constant voltage diode is connected to the base of said NPN transistor.

6. The built-in drive-power-source semiconductor device according to claim 4, wherein said shortcircuiting semiconductor element includes an insulated gate semiconductor element, the anode of said second constant voltage diode is coupled through a resistor to the source electrode of said output insulated gate semiconductor element, and the anode of said second constant voltage diode is coupled to the gate of said shortcircuiting insulated gate semiconductor element.

7. The built-in drive-power-source semiconductor device according to claim 1, wherein said output control means includes means for emitting light in response to said input control signal, and means for generating a photo-voltage in response to said emitted light, said photo-voltage generating means producing s current, and said charging means further includes means for conducting at least a portion of the current produced by said photo-voltage generating means to said battery means for charging said battery means.

8. The built-in drive-power-source semiconductor device according to claim 7, wherein said output control means includes means for converting said photo-voltage to an output control signal, and means for transmitting said output control signal to said output switch means.

9. The built-in drive-power-source semiconductor device according to claim 8, wherein said light emitting means includes an LED, and said photo-voltage generating means includes a photo diode array.

10. The built-in drive-power-source semiconductor device according to claim 7, wherein said output switch means includes an output insulated gate semiconductor element.

11. The built-in drive-power-source semiconductor device according to claim 10, wherein:

said output control means includes gate drive means for charging and discharging a gate of said output insulated gate semiconductor element, said battery means includes a capacitor for supplying power to said gate drive means, said charge switch means, including a charging semiconductor element and a reverse current blocking diode, coupled in a charging path between a drain electrode of said output insulated gate semiconductor element and said capacitor for charging said capacitor with a voltage from across the drain electrode and a source electrode of said output insulated gate semiconductor element, said constant voltage output means includes a resistor and a first constant voltage diode coupled between said drain electrode and said source electrode of said output insulated gate semiconductor element, an anode of said first constant voltage diode being connected to the source electrode of said output insulated gate semiconductor element, and a cathode of said first constant voltage diode being connected to a gate of said charging semiconductor element and said resistor, and said charge termination means includes a shortcircuiting semiconductor element having a gate connected to a high potential side of said capacitor through a second constant voltage diode generating said predetermined charge potential level, for shortcircuiting the current flowing through said first constant voltage diode when the voltage across said capacitor reaches said predetermined charge potential level.

12. The built-in drive-power-source semiconductor device according to claim 11, wherein said shortcircuiting semiconductor element is an NPN transistor, and the anode of said second constant voltage diode is connected to the base of said NPN transistor.

13. The built-in drive-power-source semiconductor device according to claim 11, wherein said shortcircuiting semiconductor element is an insulated gate semiconductor element, the anode of said second constant voltage diode is coupled through a resistor to the source electrode of said output insulated gate semiconductor element, and the anode of said second constant voltage diode is coupled to the gate of said shortcircuiting insulated gate semiconductor element.

14. The built-in drive-power-source semiconductor device according to claim 1, wherein said output control means further comprises disabling means for disabling said output switch means from closing when said charge potential of said battery means is less than said predetermined charge potential level.

15. The built-in drive-power-source semiconductor device according to claim 14, wherein:

said output control means includes means for emitting light in response to said input control signal, means for generating a photo-voltage in response to said emitted light, said photo-voltage generating means producing a current; and said charging means further includes means for conducting at least a portion of the current produced by said photo-voltage generating means to said battery means for charging said battery means.

16. The built-in drive-power-source semiconductor device according to claim 15, wherein said output control means includes means for converting said photo-voltage to an output control signal, and means for transmitting said output control signal to said output switch means.

17. The built-in drive-power-source semiconductor device according to claim 16, wherein said light emitting means includes an LED, and said photo-voltage generating means includes a photo diode array.

18. The built-in drive-power-source semiconductor device according to claim 14, wherein said output switch means includes an output insulated gate semiconductor element.

19. The built-in drive-power-source semiconductor device according to claim 18, wherein:

said output control means includes gate drive means for charging and discharging the gate of said output insulated gate semiconductor element, said battery means includes a capacitor for supplying power to said gate drive means, said charge switch means includes a charging semiconductor element and a reverse current blocking diode coupled in a charging path between a drain electrode of said output insulated gate semiconductor element and said capacitor for charging said capacitor with a voltage from across the drain electrode and a source electrode of said output insulated gate semiconductor element, said constant voltage output means includes a resistor and a first constant voltage diode coupled between said drain electrode and said source electrode of said output insulated gate semiconductor element, an anode of said first constant voltage diode being connected to the source electrode of said output insulated gate semiconductor element, and a cathode of said first constant voltage diode being connected to a gate of said charging semiconductor element and one end of said resistor, the other end of said resistor being connected to said drain electrode of said output insulated gate semiconductor element, and said charge termination means includes a shortcircuiting semiconductor element, having a gate connected to a high potential side of said capacitor through a second constant voltage diode generating said predetermined charge potential level, for shortcircuiting the current flowing through said first constant voltage diode when the voltage across said capacitor reaches said predetermined charge potential level.

20. The built-in drive-power-source semiconductor device according to claim 19, wherein said shortcircuiting semiconductor element is an NPN transistor, and the anode of said second constant voltage diode is connected to the base of said NPN transistor.

21. The built-in drive-power-source semiconductor device according to claim 19, wherein said shortcircuiting semiconductor element is an insulated gate semiconductor element, the anode of said second constant voltage diode is coupled through a resistor to the source electrode of said output insulated gate semiconductor element, and the anode of said second constant voltage diode is coupled to the gate of said shortcircuiting insulated gate semiconductor element.

22. A built-in drive-power-source semiconductor device comprising:

output switch means for switching power between first and second terminals of a circuit external to said semiconductor device;

output control means for controlling said output switch means in response to an input control signal;

battery means for supplying drive power to said output control means;

charging means for charging said battery means from said circuit external to said semiconductor device, said charging means including charge switch means for conducting charge current to said battery means from said external circuit; and disabling means for disabling said output switch means when a charge potential of said battery means is less than a predetermined charge potential level.

23. The built-in drive-power-source semiconductor device according to claim 22, wherein:

said output control means includes means for emitting light in response to said input control signal, and means for generating g photo-voltage in response to said emitted light, said photo-voltage generating means producing a current; and said charging means further includes means for conducting at least a portion of the current produced by said photo-voltage generating means to said battery means for charging said battery means.

24. The built-in drive-power-source semiconductor device according to claim 23, wherein said output control means includes means for converting said photo-voltage to an output control signal, and means for transmitting said output control signal to said output switch means.

25. The built-in drive-power-source semiconductor device according to claim 24, wherein said light emitting means includes an LED, and said photo-voltage generating means includes a photo diode array.

26. The built-in drive-power-source semiconductor device according to claim 22, wherein said output switch means includes an output insulated gate semiconductor element.

27. The built-in drive-power-source semiconductor device according to claim 26, wherein:

said output control means includes gate drive means for charging and discharging a gate of said output insulated gate semiconductor element, said battery means includes a capacitor for supplying power to said gate drive means, said charge switch means includes a charging semiconductor element and a reverse current blocking diode coupled in a charging path between a drain electrode of said output insulated gate semiconductor element and said capacitor for charging said capacitor with a voltage from across the drain electrode and a source electrode of said output insulated gate semiconductor element, said constant voltage output means includes a resistor and a first constant voltage diode coupled between said drain electrode and said source electrode of said output insulated gate semiconductor element, an anode of said first constant voltage diode being connected to the source electrode of said output insulated gate semiconductor element, and a cathode of said first constant voltage diode being connected to a gate of said charging semiconductor element and one end of said resistor, the other end of said resistor being connected to said drain electrode of said output insulated gate semiconductor element, and said charge termination means includes a shortcircuiting semiconductor element, having a gate connected to a high potential side of said capacitor through a second constant voltage diode generating said predetermined charge potential level, for shortcircuiting the current flowing through said first constant voltage diode when the voltage across said capacitor reaches said predetermined charge potential level.

28. The built-in drive-power-source semiconductor device according to claim 27, wherein said shortcircuiting semiconductor element is an NPN transistor, and the anode of said second constant voltage diode is connected to the base of said NPN transistor.

29. The built-in drive-power-source semiconductor device according to claim 27, wherein said shortcircuiting semiconductor element is an insulated gate semiconductor element, an anode of said second constant voltage diode is coupled through a resistor to the source electrode of said output insulated gate semiconductor element, and the anode of said second constant voltage diode is coupled to a gate of said shortcircuiting insulated gate semiconductor element.

30. A built-in drive-power-source semiconductor device comprising:

output switch means for switching power between first and second terminals of a circuit external to said semiconductor device;

output control means for controlling said output switch means in response to an input control signal;

battery means for supplying drive power to said output control means; and charging means for charging said battery means from said circuit external to said semiconductor device, said charging means including charge switch means for conducting charge current to said battery means from said external circuit;

wherein said output control means includes means for emitting light in response to said input control signal, and means for generating a photo-voltage in response to said emitted light, said photo-voltage generating means producing a current, and said charging means further includes means for conducting at least a portion of the current produced by said photo-voltage generating means to said battery means for charging said battery means.

31. The built-in drive-power-source semiconductor device according to claim 30, wherein said output control means includes means for converting said photo-voltage to an output control signal, and means for transmitting said output control signal to said output switch means.

32. The built-in drive-power-source semiconductor device according to claim 31, wherein said light emitting means includes an LED, and said photo-voltage generating means includes a photo diode array.

33. The built-in drive-power-source semiconductor device according to claim 30, wherein said output switch means includes an output insulated gate semiconductor element.

34. The built-in drive-power-source semiconductor device according to claim 33, wherein:

said output control means includes gate drive means for charging and discharging a gate of said output insulated gate semiconductor element, said battery means includes a capacitor for supplying power to said gate drive means, said charge switch means includes a charging semiconductor element and a reverse current blocking diode coupled in a path between a drain electrode of said output insulated gate semiconductor element and said capacitor for charging said capacitor with a voltage from across the drain electrode and a source electrode of said output insulated gate semiconductor element, said constant voltage output means includes a resistor and a first constant voltage diode coupled between said drain electrode and said source electrode of said output insulated gate semiconductor element, an anode of said first constant voltage diode being connected to the source electrode of said output insulated gate semiconductor element, and a cathode of said first constant voltage diode being connected to a gate of said charging semiconductor element and one end of said resistor, the other end of said resistor being connected to said drain electrode of said output insulated gate semiconductor element, and said charge termination means includes a shortcircuiting semiconductor element, having a gate connected to a high potential side of said capacitor through a second constant voltage diode generating said predetermined charge potential level, for shortcircuiting the current flowing through said first constant voltage diode when the voltage across said capacitor reaches said predetermined charge potential level.

35. The built-in drive-power-source semiconductor device according to claim 34, wherein said shortcircuiting semiconductor element is an NPN transistor, and the anode of said second constant voltage diode is connected to the base of said NPN transistor.

36. The built-in drive-power-source semiconductor device according to claim 34, wherein said shortcircuiting semiconductor element is an insulated gate semiconductor element, the anode of said second constant voltage diode is coupled through a resistor to the source electrode of said output insulated gate semiconductor element, and the anode of said second constant voltage diode is coupled to the gate of said shortcircuiting insulated gate semiconductor element.

* * * * *

UNITED STATES PATENT AND TRADEMARK OFFICE
CERTIFICATE OF CORRECTION

PATENT NO. : 5,475,333
DATED : December 12, 1995
INVENTOR(S) : Naoki KUMAGAI

It is certified that error appears in the above-indentified patent and that said Letters Patent is hereby corrected as shown below:

Item [57], Abstract, line 9, "is turn off" should read --to turn off--.

Item [57], Abstract, line 10, "batter" should read --battery--.

Claim 7, column 19, line 26, "s" should read --a--.

Claim 23, column 21, line 57, "g" should read --a--.

Signed and Sealed this

Eighth Day of October, 1996

Attest:

BRUCE LEHMAN

Attesting Officer   Commissioner of Patents and Trademarks